United States Patent [19]

Rodder et al.

[11] Patent Number: 5,217,924
[45] Date of Patent: Jun. 8, 1993

[54] METHOD FOR FORMING SHALLOW JUNCTIONS WITH A LOW RESISTIVITY SILICIDE LAYER

[75] Inventors: Mark S. Rodder, Dallas; Robert H. Havemann, Garland, both of Tex.

[73] Assignee: Texas Instruments Incorporated, Dallas, Tex.

[21] Appl. No.: 644,855

[22] Filed: Jan. 22, 1991

Related U.S. Application Data

[63] Continuation of Ser. No. 351,513, May 12, 1989, abandoned.

[51] Int. Cl.$^5$ .................. H01L 21/265; H01L 21/283
[52] U.S. Cl. ..................................... 437/200; 437/20; 437/162; 148/DIG. 19
[58] Field of Search ................ 437/200, 162, 192, 20; 148/DIG. 147, DIG. 19; 357/67 S, 71 S

[56] References Cited

U.S. PATENT DOCUMENTS

| | | | |
|---|---|---|---|
| 4,339,869 | 7/1982 | Reihl et al. | 437/200 |
| 4,551,908 | 11/1985 | Nagasawa et al. | 148/DIG. 19 |
| 4,558,507 | 12/1985 | Okabayashi et al. | 437/200 |
| 4,587,718 | 5/1986 | Haken et al. | 437/200 |
| 4,622,735 | 11/1986 | Shibata | 148/DIG. 19 |
| 4,788,160 | 11/1988 | Havemann et al. | 148/DIG. 147 |

FOREIGN PATENT DOCUMENTS

| | | | |
|---|---|---|---|
| 0160952 | 7/1986 | Japan | 437/200 |
| 0225838 | 10/1986 | Japan | 437/200 |
| 0298109 | 12/1987 | Japan | 437/200 |
| 0216334 | 9/1988 | Japan | 437/200 |

OTHER PUBLICATIONS

Wong, D. L., et al., "A Novel Silicided Shallow Junction Technology for CMOS VLSI", *Materials Research Society Symp. Proc.*, vol. 71, 1986 Materials Research Society, pp. 379–385.

Horiuchi, M., et al. "Solid-II: High-Voltage High--Gain Kilo-Angstrom-Channel-Length CMOSFET's Using Silicide with Self-Aligned Ultrashallow (3S) Junction", *IEEE Transactions on Electron Devices*, vol. ED-33, No. 2, Feb., 1986, pp. 260-268.

Nagasawa, E. et al., "Mo— and Ti-Silicided Low-Resistance Shallow Junctions Formed Using the Ion Implantation Through Metal Technique", *IEEE Transactions on Electron Devices*, vol. ED-34, No. 3, Mar., 1987, pp. 581–586.

*Primary Examiner*—T. N. Quach
*Attorney, Agent, or Firm*—Richard A. Stoltz; James C. Kesterson; Richard L. Donaldson

[57] ABSTRACT

A method for forming a shallow junction (56) with a relatively thick metal silicide (52) thereover is provided. A first relatively thin layer (38) of a metal is deposited over the surface of a semiconductor substrate. An impurity (40) is then implanted (42) into or through the first layer (38). A relatively thick second layer (48) of metal is deposited over the first layer (38). An anneal process (50) is then performed to out-diffuse the impurities (40) from the first layer (38) into the substrate (32). The anneal also forms a combined metal silicide (52) from the first layer (38) and the second layer (48). The junction (56) thus formed has less surface damage, reduced spiking and reduced implant straggle than junctions formed according to the prior art. An alternate technique is also disclosed wherein an implant into or through a silicide layer is utilized.

11 Claims, 2 Drawing Sheets

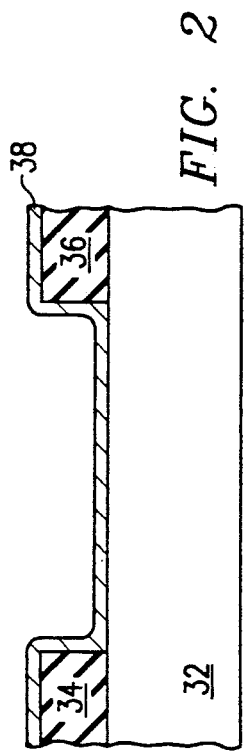
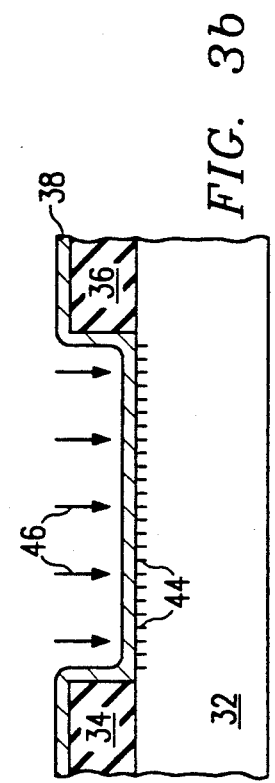
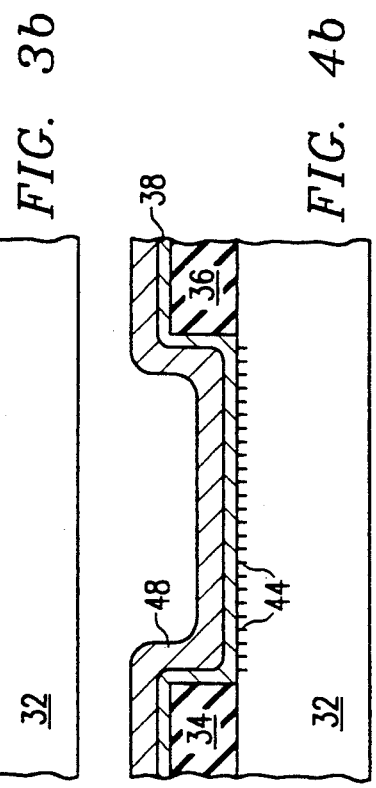
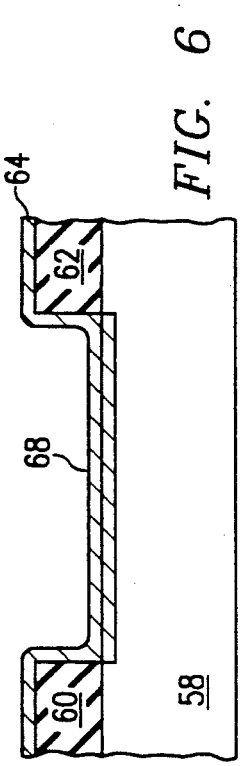
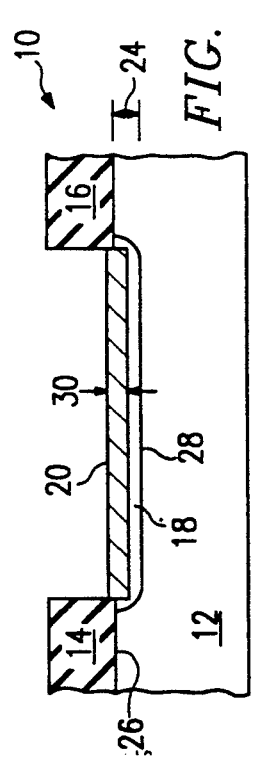
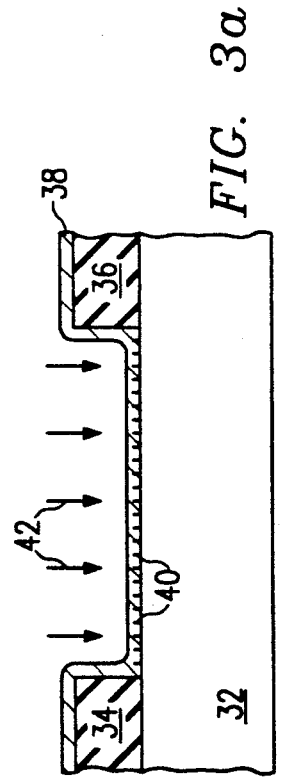
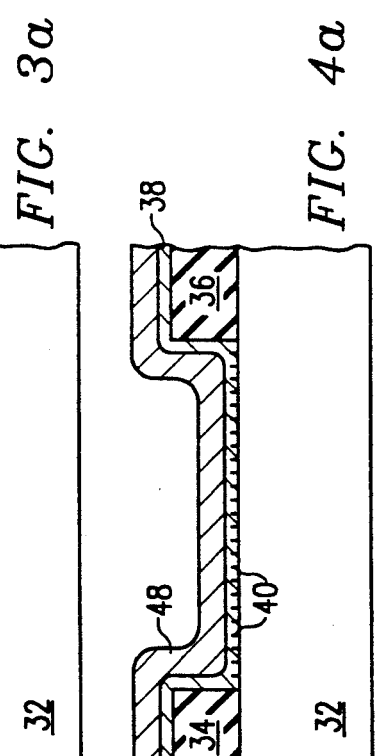
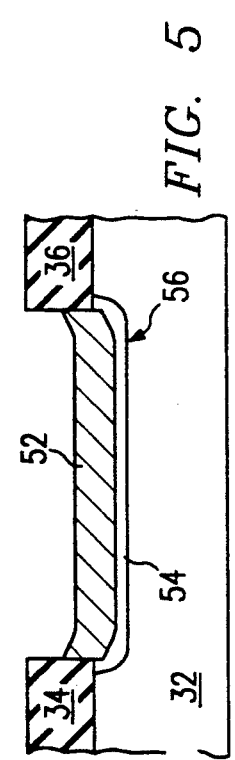

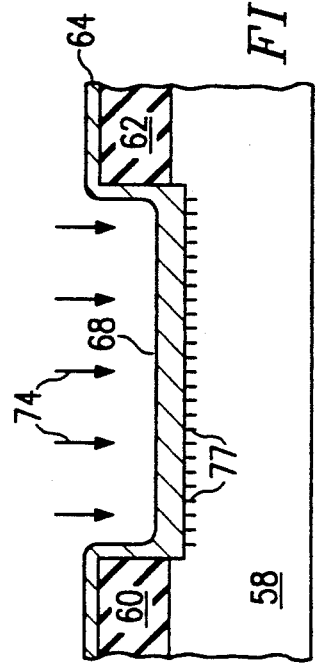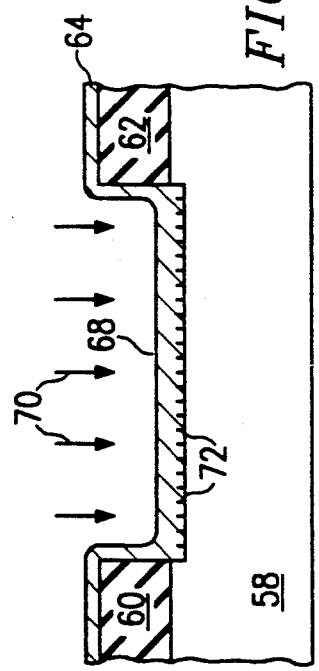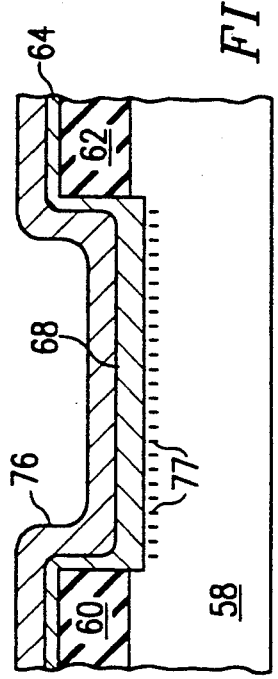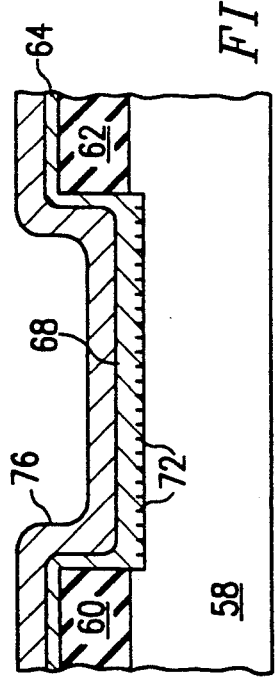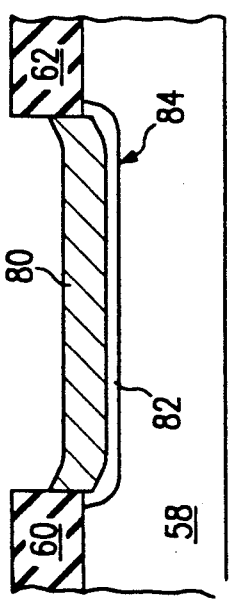

METHOD FOR FORMING SHALLOW JUNCTIONS WITH A LOW RESISTIVITY SILICIDE LAYER

This application is a continuation of application Ser. No. 351,531, filed May 12, 1989, abandoned.

RELATED APPLICATIONS

This patent application is related to the following patent applications: "Process for Formation of Shallow Silicated Junctions", Ser. No. 032,836, filed Mar. 31, 1987, U.S. Pat. No. 4,788,160; "A BICMOS Process for Forming Shallow NPN Emitters and MOSFET Source/Drains", Ser. No. 045,978, filed May 1, 1987, U.S. Pat. No. 4,816,432; and "A BICMOS Process for Forming Self-Aligned NPN Emitters and Bases and MOSFET/Source Drains", Ser. No. 057,871, filed Jun. 2, 1987, U.S. Pat. No. 4,774,204. All of the above applications have been assigned to Texas Instruments Incorporated.

TECHNICAL FIELD OF THE INVENTION

This invention relates in general to integrated circuit devices, and in particular to a method for forming a shallow junction with a low resistivity silicide layer thereon.

BACKGROUND OF THE INVENTION

The formation of integrated circuit devices such as transistors requires the formation of diode junctions between semiconductor regions of opposite doping type. For example, the source and drain regions of a typical MOS transistor are formed by diffusing a dopant of one conductivity type into a substrate of opposite conductivity type. These source/drain regions are separated by a gate material, typically polysilicon, residing on a thin gate dielectric. When an appropriate voltage is placed on the gate, current can flow between the source and drain of the MOSFET. To reduce the series resistance of the source/drain regions in this current path, a silicide cladding is typically used. Since the silicide formation consumes part of the source/drain region, the source/drain function must be deep enough to prevent spiking of the silicide through the junction, since this would cause junction leakage and lower transistor performance. Deeper junctions in turn also lead to lower transistor performance due to parasitic capacitance and inhibited scalability of the gate length. Thus, a tradeoff must normally be made between junction depth and silicide thickness, since shallower junctions are incompatible with thicker silicide layers.

Heretofore, attempts to form shallow junctions with a thick silicide cover have been less than satisfactory. One such method is referred to as ion-implantation through metal (ITM). In ITM, a metal layer is applied to the silicon surface which will be subsequently doped. Ion-implantation is then conducted through the metal and into the silicon to form the doped region. Silicide is then formed over the doped region by a standard annealing process such as a furnace anneal or a rapid thermal anneal. Unfortunately, to meet the dual objectives of a shallow junction and a thick silicide layer, metal must be deposited to a typical thickness of at least 1,000 Angstroms. Implanting a dopant through a metal layer of 1,000 Angstroms requires high implant energy which can damage the surface of the metal layer and create defects (spiking) by driving some of the metal atoms into the silicon substrate.

An alternative to ITM is to first form the silicide over the region to be doped and then implant the impurities into the silicide as close to the silicon as possible. A subsequent drive-in annealing process is used to diffuse the impurities from the silicide layer into the silicon substrate to form the doped regions and to form shallow junctions. This method has some of the same inadequacies as the ITM method described above and more. Now rather than a fairly thick layer of metal to implant through, there is an increased depth due to the formation of the silicide. Additionally, the high implant energy required increases the likelihood of the impurities spreading out into the silicon more than desired, due to increased implant straggle at high implant energies. Thus, there is a need for a method to form a shallow junction with a relatively thick layer of silicide thereover having low sheet resistivity without surface damage or implant straggle.

Another alternative to ITM is to apply a metal layer to the silicon surface which is to be doped and subsequently to implant dopants into the metal rather than through the metal. However, the use of a thick metal layer to meet the objective of a low resistivity silicide layer still requires high implant energy at which to implant dopants. The high implant energy also needed for these methods again leads to creation of defects by reasons described previously.

SUMMARY OF THE INVENTION

The present invention disclosed herein comprises a method for forming shallow junctions with a low resistivity silicide layer for an integrated circuit device, which eliminates or substantially reduces problems associated with prior shallow junction formation methods. The present invention allows the formation of a shallow junction while maintaining a low sheet resistivity due to a thick silicide layer.

In accordance with one aspect of the invention, a semiconductor substrate is implanted with impurities. A thin layer of metal is first deposited over the semiconductor substrate. The impurity is then implanted through the metal into the silicon substrate at a relatively low implant energy. A second thicker layer of metal is deposited over the first thin layer of metal after the implant has been conducted. The deposition of the second layer forms one relatively thick combined yet homogeneous layer of the metal. A standard anneal process is performed to form a metal silicide layer over the implant areas to provide low sheet resistivity.

In another aspect of the present invention, a thin layer of a metal is deposited over the semiconductor substrate. A standard anneal is performed to form a thin layer of metal silicide. The impurities are then implanted through the thin layer of metal silicide using low implantation energy. A second thicker layer of the metal is then deposited over the thin layer of metal silicide followed by a subsequent anneal to form a combined relatively thick layer of metal silicide.

It is a technical advantage of the present invention that a shallow junction is formed while maintaining a low sheet resistivity silicide layer. It is a further technical advantage of the present invention that implant straggle is reduced due to the use of relatively low implant energy. It is a further technical advantage of the present invention that surface damage and the likelihood of spiking are reduced.

BRIEF DESCRIPTION OF THE DRAWINGS

For a more complete understanding of the present invention and for further advantages thereof, reference is now made to the following Detailed Description taken in conjunction with the accompanying Drawings in which:

FIG. 1 is cross-sectional view of a device formed in accordance with the present invention;

FIG. 2 is a cross-sectional view of a first step of fabrication according to the method of the present invention;

FIGS. 3a and 3b are cross-sectional views of alternate second steps of fabrication;

FIGS. 4a and 4b are cross-sectional views of alternative third steps of fabrication;

FIG. 5 is a cross-sectional view of a fourth step of fabrication;

FIG. 6 is a cross-sectional view of a first step of fabrication of an alternate embodiment of the present invention; and FIGS. 7a, 7b, 8a, 8b, and 9 are cross-sectional views of subsequent steps of fabrication of the alternate embodiment of the present invention.

DETAILED DESCRIPTION OF THE INVENTION

Referring to FIG. 1, a cross-sectional view of an integrated circuit device constructed in accordance with the present invention is generally identified by the reference numeral 10. The device 10 comprises a semiconductor substrate 12, which may comprise silicon, and oxide structures 14 and 16 formed over portions of the substrate 12. A doped region 18 (of opposite conductivity type to substrate 12) is formed between the oxide regions 14 and 16 in accordance with the preferred embodiment of the present invention, which will be subsequently described in greater detail. Formed over the doped region 18 is a metal silicide 20, which provides a low sheet resistivity to minimize parasitic series resistance of an associated transistor. Throughout this application, when referring to a junction depth, it is to be understood that the junction depth is that indicated by the reference numeral 24 in FIG. 1. The junction depth 24 is the distance from the surface 26 of the substrate 12 to the bottom 28 of the doped region 18. Additionally, when the thickness of the silicide is referred to, it is meant the distance between the top and bottom surfaces of the silicide 20 as indicated by the reference numeral 30.

In FIGS. 2-4, like items are identified by like and similar numerals for ease of reference. Referring first to FIG. 2, a cross-sectional view of a first step in accordance with the preferred embodiment of the present method is illustrated. An integrated circuit device comprising a substrate 32 and oxide structures 34 and 36 is to have a shallow junction formed thereon. A relatively thin first layer 38 of a metal is deposited over the entire device. The metal for the first layer 38 may comprise, for example, titanium. The first layer 38 is deposited to a thickness of between 200 and 600 Angstroms.

Referring to FIGS. 3a and 3b, alternative second steps in accordance with the preferred embodiment of the present invention are illustrated. In FIG. 3a, impurities 40 are implanted into the first layer 38. The impurities 40 may comprise, for example, a dopant such as boron or phosphorous and are implanted, as indicated by the reference numeral 42, with a relatively low implant energy. It is important to note that the implant energy is relatively low due to the thin first layer 38. Low implant energy allows the impurities 40 to be implanted without damaging the surfaces of the first layer 38 and also minimizes the "knock-on" phenomenon, or the forcing of atoms from the first layer 38 into the substrate 32.

Referring to FIG. 3b, an alternate technique is illustrated wherein impurities 44 are implanted through the first layer 38 by an implanting process as indicated by the reference numeral 46. The impurities 44 are thus deposited in the upper portion of substrate 32. As in FIG. 3a, the implanting process 46 of FIG. 3b is conducted at a relatively low implant energy to prevent damage to the surfaces of the first layer 38, to prevent spiking and to decrease implant straggle.

Referring to FIGS. 4a and 4b, cross-sectional views of the subsequent steps following those of either FIGS. 3a and 3b, respectively, are illustrated. In both FIGS. 4a and 4b, a relatively thick second layer 48 of a metal is deposited over the first layer 38. The metal used for the second layer 48 may be, for example, titanium. The second layer 48 is deposited to a thickness of approximately 800 Angstroms thus giving a combined thickness of between 1000–1400 Angstroms for the first layer 38 plus the second layer 48. The total combined thickness may be tailored to meet the desired sheet resistivity, and the 1000–1400 Angstroms is merely one possible example. The resulting structures of either FIGS. 4a or 4b are substantially identical, except for the location of the impurities 40 or 44.

Referring to FIG. 5, the final steps in accordance with the preferred embodiment of the present invention are illustrated. An anneal is conducted to form a metal silicide 52. The anneal may be, for example, a furnace anneal or a rapid thermal anneal, both of which are well known in the art. If the implant was into the first layer 38, the anneal 50 will also out-diffuse the impurities 40 into the substrate 32 therebelow to form the doped region 54. If the impurities were implanted into the substrate 32 as shown in FIG. 4b, the anneal 50 will form the silicide 52 (as well as slightly diffuse impurities 40 further into the substrate 32). Although not shown, it is to be understood that appropriate etchings must also be performed to remove any unreacted metal from the structures 34 and 36.

Thus, the junction, generally identified by the reference numeral 56, formed by the method of the present invention, has a shallow depth with a relatively thick silicide thereover. Testing has shown that the silicide 52 formed by the combined first layer 38 and second layer 48 is homogeneous and has approximately the same sheet resistivity as a single layer deposited and annealed. Therefore, the junction 56 does not have the damage as typically found in the prior art, such as surface damage to the silicide, spiking and increased implant straggle.

In FIGS. 6-9, like items are identified by like and similar numerals for ease of reference. Referring first to FIG. 6, the first step of fabrication of an alternative embodiment of the present invention is illustrated. A substrate 58, such as silicon, has an oxide structure 60 and 62 formed thereon. A relatively thin first layer 64 of a metal, such as titanium, is deposited over the structures 60 and 62 and the substrate 58. An anneal, which may comprise a furnace anneal or a rapid thermal anneal, is then performed to create a metal silicide 68. As is well known in the art, the formation of a silicide combines portions of the silicon of the substrate 58 with the metal of the layer 64. The silicide 68 thus formed is a relatively thin layer on the order of between 200 and 600 Angstroms.

Referring to FIGS. 7a and 7b, alternative subsequent steps of fabrication in accordance with the method of FIG. 6 are shown. Referring first to FIG. 7a, an implant process 70 is performed to implant impurities 72 into the silicide 68. The implant process 70 is performed, for example, with an ion implanter at a relatively low energy level to prevent damage to the surface of the silicide 68, to prevent spiking into the substrate 58 and to reduce implant straggle.

Referring to FIG. 7b, an implant process 74 is conducted to implant impurities 77 through the silicide 68 and into the substrate 58. As with the implant process 70 of FIG. 7a, the implant process 74 is conducted at a relatively low implant energy to prevent damage to the silicide 68, to prevent spiking and to reduce implant straggle.

Referring to FIGS. 8a and 8b, a subsequent step to the method in accordance with either FIGS. 7a and 7b, respectively, is illustrated. In FIGS. 8a and 8b, a relatively thick second layer 76 of a metal is deposited over the remaining unreacted portions of the first layer 64 and the silicide 68. The second layer 76 may comprise, for example, a metal such as titanium. The second layer 76 may be deposited, for example, to a thickness of approximately 800 Angstroms, but it is to be understood that the actual thickness may be tailored to meet a desired sheet resistivity.

Referring to FIG. 9, the final steps in accordance with the alternative embodiment of FIG. 6 are illustrated. It should be noted that, if there were any by-products formed by the anneal 66 of FIG. 6, such by-products may be removed either before or after the implant processes of either 70 or 74 of FIGS. 7a and 7b, respectively. For example, if a titanium nitrite layer is formed over the silicide 68, it should be removed prior to the deposition of the second layer 76. A second anneal 78 is performed to convert the second layer 76 into a silicide, which combines with the first silicide 68 to form a homogeneous silicide 80. If the implant process 70 of FIG. 7a was used to place impurities 72 within the first silicide layer 68, the second anneal 78 will out-diffuse the impurities 72 into the substrate 58 to form a doped region 82. If the implant process 74 of FIG. 7b were used, the second anneal 78 will merely serve second layer 76 with the first silicide 68 as well as slightly diffuse impurities 72 further into the substrate 58. The second anneal 78 may be, for example, a furnace anneal or a rapid thermal anneal, as are well known in the art. Although not shown, it is to be understood that the unreacted metals over the structures 60–62 are to be removed by an appropriate etch.

A junction 84 thus formed comprises a relatively shallow doped region 82 and a relatively thick silicide 80 thereover. Due to the low implant energy used to implant the impurities, there is less surface damage, less spiking and a reduced implant straggle than is found in the junctions of an integrated circuit device formed in accordance with the prior art. It has been found through testing that the combined silicide layer 80 has approximately the same sheet resistivity as is found with a single layer silicide. The present invention allows the junction 84 to be formed at a depth of approximately 750 to 1,000 Angstroms less than in the prior art.

Although the present invention has been described with respect to a specific preferred embodiment thereof, various changes and modifications may be suggested to one skilled in the art, and it is intended that the present invention encompass such changes and modifications as fall within the scope of the appended claims.

I claim:

1. A method for forming a shallow junction with a low resistivity silicide layer on a source/drain region of an integrated circuit device on a silicon semiconductor substrate, comprising the steps of:
   depositing a first metal layer on the source/drain region of the silicon substrate;
   then implanting a dopant into and through said first metal layer into said semiconductor substrate to form a doped source/drain region;
   then depositing a second metal layer over said source/drain region, said second metal layer having a substantially greater thickness than said first metal layer; and
   annealing said first and second layers with a portion of said silicon substrate to form a metal silicide over said doped region.

2. The method of claim 1, wherein the step of depositing a first metal layer comprises depositing titanium to a depth from 200–600 Angstroms.

3. The method of claim 1, wherein the step of depositing said second layer comprises depositing titanium to a thickness of approximately 800 Angstroms.

4. A method for forming a shallow junction with a low resistivity silicide layer on a source/drain region of an integrated circuit device on a silicon semiconductor substrate, comprising the steps of:
   depositing a relatively thin, first metal layer on the source/drain region of the silicon substrate;
   annealing said first metal layer to combine metal of said first metal layer with a portion of said silicon substrate to form a relatively thin first metal silicide layer;
   then implanting a dopant through said first metal silicide layer to form a shallow doped source/drain region;
   then depositing a second metal layer over said first silicide layer, said second metal layer having a greater thickness than said first metal layer; and
   then annealing said second metal layer to form a combined metal silicide layer over said shallow doped source/drain region.

5. The method of claim 4, wherein said step of depositing a first layer comprises depositing titanium.

6. The method of claim 4, wherein said step of depositing a second layer comprises depositing titanium.

7. The method of claim 4, wherein said step of implanting comprises implanting said dopant into said first silicide.

8. The method of claim 4, wherein the step of implanting comprises implanting with a relatively low implant energy to reduce surface damage to said first silicide, to reduce spiking and to reduce implant straggle.

9. The method of claim 4, wherein the step of implanting comprises implanting with an ion-implanter.

10. The method of claim 4, wherein the thickness of said first metal layer is 200–600 Angstroms.

11. The method of claim 4, wherein the thickness of said second metal layer is approximately 800 Angstroms.

* * * * *